United States Patent
Uchida

(10) Patent No.: US 6,812,556 B2
(45) Date of Patent: Nov. 2, 2004

(54) MULTI-CHIP PACKAGE SEMICONDUCTOR DEVICE HAVING PLURAL LEVEL INTERCONNECTIONS

(75) Inventor: Yasufumi Uchida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/392,934

(22) Filed: Mar. 21, 2003

(65) Prior Publication Data

US 2003/0189258 A1 Oct. 9, 2003

(30) Foreign Application Priority Data

Apr. 5, 2002 (JP) ........................................ 2002-103967

(51) Int. Cl.[7] .............................................. H01L 23/02
(52) U.S. Cl. ...................... 257/686; 257/666; 257/692; 257/787; 257/696
(58) Field of Search ................................ 257/666, 668, 257/685, 686, 690, 692, 723, 777, 784, 787, 696

(56) References Cited

U.S. PATENT DOCUMENTS

| | | | | |
|---|---|---|---|---|
| 5,523,608 A | * | 6/1996 | Kitaoka et al. | 257/433 |
| 5,724,233 A | * | 3/1998 | Honda et al. | 361/813 |
| 5,741,369 A | * | 4/1998 | Yamamura et al. | 136/251 |
| 6,104,084 A | * | 8/2000 | Ishio et al. | 257/666 |
| 6,118,184 A | * | 9/2000 | Ishio et al. | 257/787 |
| 2002/0027271 A1 | * | 3/2002 | Vaiyapuri | 257/676 |
| 2003/0116862 A1 | * | 6/2003 | Chiang et al. | 257/778 |

FOREIGN PATENT DOCUMENTS

| | | |
|---|---|---|
| JP | 06-045476 | 2/1994 |
| JP | 10-214934 | 8/1998 |
| JP | 2001-007277 | 1/2001 |
| JP | 2001-196507 | 7/2001 |
| JP | 2003-163325 | 6/2003 |
| WO | WO 01/26155 | 4/2001 |

* cited by examiner

Primary Examiner—Nathan J. Flynn
Assistant Examiner—Pershelle Greene
(74) Attorney, Agent, or Firm—Valentine Francos & Whitt, PLLC

(57) ABSTRACT

A semiconductor device including a package body, a substrate contained within the package body and having a first side and an opposite second side, a first chip mounted on the first side of the substrate and within the package body, a second chip mounted on the second side of the substrate and within the package body and a plurality of leads each including an inner lead portion contained within the package body and an outer lead portion located outside the package body wherein each inner lead portion includes first and second bends to define a step configuration and wherein a distal end of each inner lead portion is mounted to the second side of the substrate.

12 Claims, 5 Drawing Sheets

MULTI-CHIP PACKAGE SEMICONDUCTOR DEVICE HAVING PLURAL LEVEL INTERCONNECTIONS

BACKGROUND OF THE INVENTION

1. Field of the Invention

The present invention relates, in general, to semiconductor device and, more particularly, to a multi-chip package having a plurality of chips.

This is a counterpart of and claims priority to Japanese patent application Serial Number 103967/2002, filed on Apr. 5, 2002, the subject matter of which is incorporated herein by reference.

2. Description of the Related Art

A conventional semiconductor device is disclosed in Japanese Patent Application Laid-Open No. 2001-7277, Hiroki ARISUMI. The conventional device has a die pad having an open portion. A signal position conversion part is mounted on the die pad. A first chip is mounted on one side of the signal position conversion part. A second chip is mounted on opposite side of the signal position conversion part in the open portion of the die pad. The first and second chips and the signal position conversion part are molded by resin, causing the die pad to be located central of the molded resin. In other words, an inner lead and the die pad are located on the same virtual plane.

However, the density of an upper portion of the molded semiconductor device is higher than one of a lower portion thereof. The amount of resin to be mold between the upper and lower portions is different. Therefore, resin may not be molded at an upper side of the first chip and the second chip in the open portion of the die pad, causing them to be exposed.

In addition, when a position of the die pad is lowered such that the resin density of the upper and lower portions is the same, a slope of a supporting lead located from the die pad to the inner lead becomes large and a length the supporting lead becomes long. The longer the length of the lead, the easier it is for the lead to become deformed. In addition, when the leads are mass-produced by manufacture machines, production tolerances of the lead are reduced.

Furthermore, the second chip is mounted on an opposite side of the signal position conversion part in the open portion of the die pad. When the second chip is molded by a resin, it is possible that the second chip is not correctly covered with resin causing a void to be generated. Therefore, the conventional semiconductor device can exhibit a crack which reduces yield.

SUMMARY OF THE INVENTION

According to one aspect of the present invention, there is provided A semiconductor device including a package body, a substrate contained within the package body and having a first side and an opposite second side, a first chip mounted on the first side of the substrate and within the package body, a second chip mounted on the second side of the substrate and within the package body and a plurality of leads each including an inner lead portion contained within the package body and an outer lead portion located outside the package body wherein each inner lead portion includes first and second bends to define a step configuration and wherein a distal end of each inner lead portion is mounted to the second side of the substrate.

The novel features of the invention will more fully appear from the following detailed description, appended claims and the accompanying drawings.

DETAILED DESCRIPTION OF THE PREFERRED EMBODIMENTS

The preferred embodiments of the present invention will be described. However, the invention is not limited to the specific embodiments. Moreover, not all the combinations of the characteristics of the present invention described in the embodiments are essential to the present invention.

Figure 1:
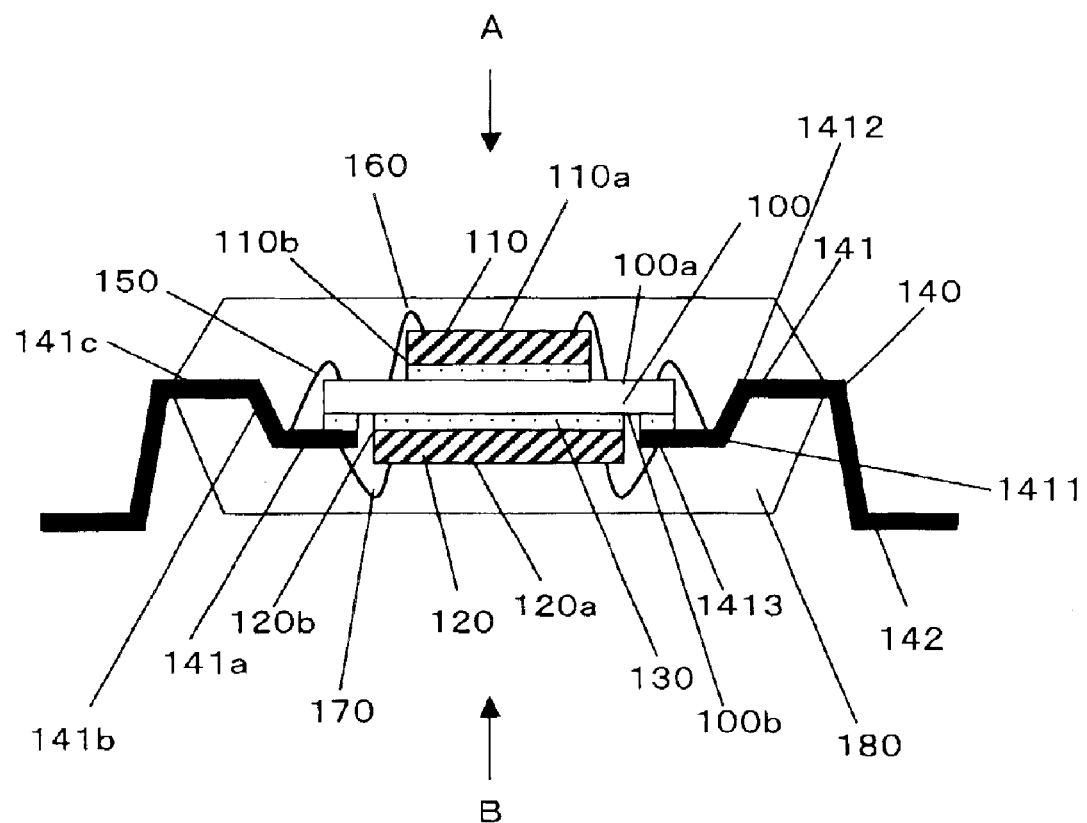
FIG. 1 is a cross sectional view of a semiconductor device according to a first preferred embodiment of the present invention.
Figure 2:
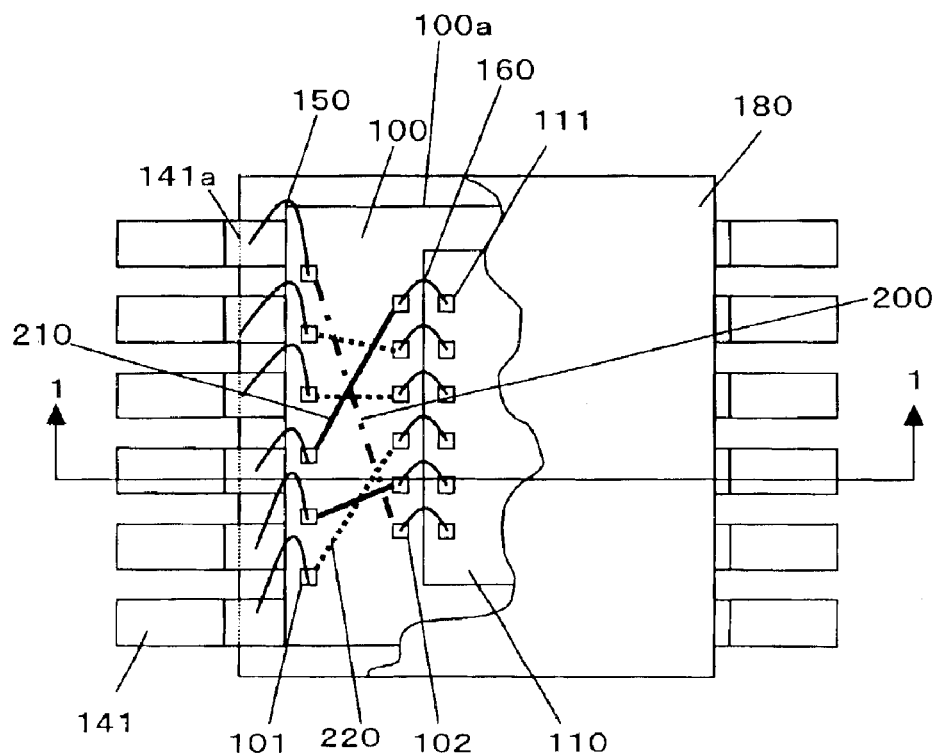
FIG. 2 is a top plan view taken in the direction of an arrow A of the semiconductor device in FIG. 1, with the resin partially removed.
Figure 3:
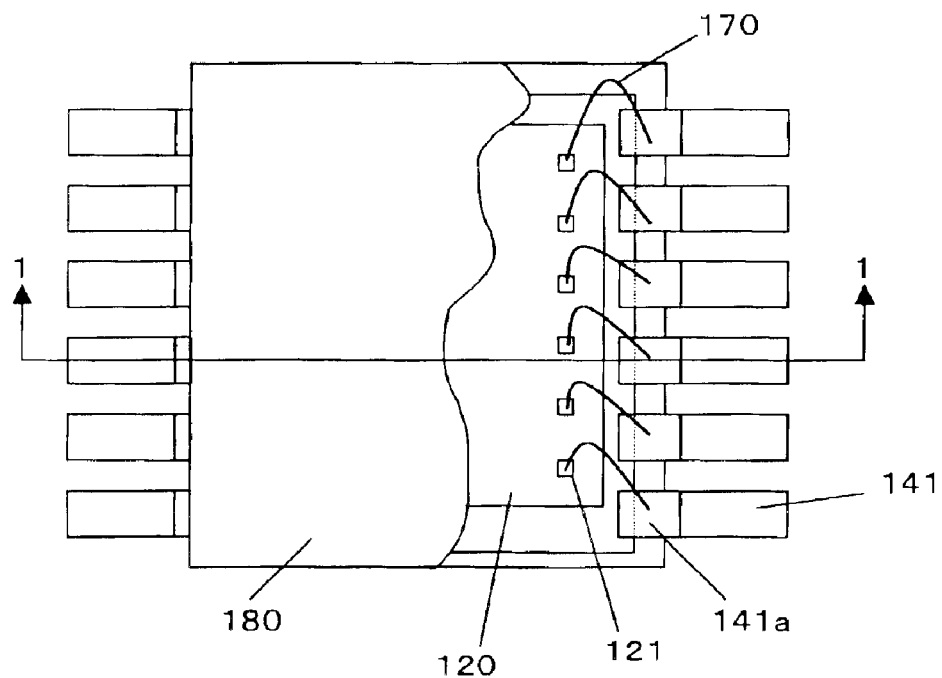
FIG. 3 is a bottom plan view taken in the direction of an arrow B of the semiconductor device in FIG. 1, with the resin partially removed.

A semiconductor device according to a first preferred embodiment of the present invention will be described with reference to FIGS. 1–3. FIG. 1 is a cross sectional view of the semiconductor device according to the first preferred embodiment of the present invention. FIG. 2 is a top plan view taken in the direction of an arrow A of the semiconductor device in FIG. 1, with the resin partially removed. FIG. 3 is a bottom plan view taken in the direction of an arrow B of the semiconductor device in FIG. 1, with the resin partially removed. Also, FIG. 1 is a cross-sectional view of the semiconductor device taken on line 1–1 of FIGS. 2–3.

The semiconductor device according to the first preferred embodiment of the present invention comprises a substrate 100, a first chip (semiconductor chip) 110, a second chip (semiconductor chip) 120, an adhesive layer 130, a plurality of leads 140, a plurality of bonding wires 150, 160 and 170, and a package body (resin) 180.

The substrate 100 is contained within the package body 180 and has a first side 100a and an opposite second side 100b. The substrate 100 contains multilayer interconnections. Also, the substrate 100 has a central area, an intermediate area surrounding the central area, and an edge area surrounding the intermediate are. The substrate 100 has a plurality of contact pads which are formed on the first side 100a thereof. The contact pads are made of copper, and a surface of each of the contact pads is covered with gold. Some contact pads are formed in the edge area on the first side 100a and other contact pads are formed in the intermediate area.

The first chip 110 is mounted in the central area on the first side 100a of the substrate 100 through the adhesive layer 130 and is contained within the package body 180. The first chip 110 has a first side 110a and an opposite second side 110b. The second side 110b of the first chip 110 faces the first side 100a of the substrate 100. Also, the first chip 110 has a plurality of contact pads which are formed in an edge area on the first side 110a thereof. The contact pads are made of copper, and a surface of each of the contact pads is covered with gold.

The second chip 120 is mounted on the second side 100b of the substrate 100 through the adhesive layer 130 and is contained within the package body 180. The second chip 120 has a first side 120a and an opposite second side 120b. The second side 120b of the first chip 120 faces the second side 100b of the substrate 100. Also, the second chip 120 has a plurality of contact pads which are formed in an edge area on the first side 120a thereof. The contact pads are made of copper, and a surface of each of the contact pads is covered with gold.

Each of the leads 140 includes an inner lead portion 141 contained within the package body 180 and an outer lead portion 142 located outside the package body 180. Each inner lead portion 141 includes a first bend 1411 and a second bend 1412 to define a step configuration, and a distal end 1413 of each inner lead portion 141 is mounted to the second side 100b of the substrate 100. Also, each inner lead portion 141 includes a first lead segment 141a located between the distal end 1413 and the first bend 1411, a second lead segment 141b located between the first end 1411 and the second bend 1412, and a third lead segment 141c located between the second bend 1412 and the outer lead portion 142. The second lead segment 141b crosses a plane extending coincident with the second surface 100b of the substrate 100.

In FIG. 2, the substrate 100 contains three-layer interconnections. An interconnection 200 is formed on the first side 100a of the substrate 100, and the first side 100a is an upper layer among the three-layer interconnections. An interconnection 210 is formed on an intermediate layer among the three-layer interconnections. An interconnection 220 is formed on the lowest layer among the three-layer interconnections. Each of the interconnections 210 and 220 is electrically connected to the contact pad by a through hole which is formed under the contact pad. The lower the layer is, the more the interconnection resistance generated by a through hole increases. Therefore, it is desirable that an interconnection having a length which is long be formed on the upper layer.

As mentioned above, the substrate 100 has the plurality of contact pads 101 formed in the edge area on the first side 110a and the plurality of contact pads 102 formed in the intermediate area. The first chip 110 has the plurality of contact pads 111 formed in an edge area on the first side 110a thereof. The bonding wires 150 extend between the first lead segment 141a of the inner lead portion 141 and the contact pads 101. The bonding wires 160 extend between the contact pads 102 and 111. It is desirable that the length of each bonding wire is formed as short as possible to prevent the wires from electrically connecting to one another. Therefore, the first chip 110 is electrically connected to the leads 140 through the bonding wires 150 and 160 and the interconnections 200, 210 or 220.

In FIG. 3, the second chip 120 has the plurality of contact pads 121 formed in the edge area on the first side 120a thereof. The bonding wires 170 extend between the first lead segment 141a of the inner lead portion 141 and the contact pads 121. It is desirable that the length of each bonding wire is formed as short as possible to prevent the wires from electrically connecting to one another. Therefore, the first chip 120 is electrically connected to the leads 140 through the bonding wires 170.

In the semiconductor device according to the first preferred embodiment of the present invention, a thickness of the package body 180 over the first side 110a of the first chip 110 is almost the same of a thickness over the first side 120a of the second chip 120. When thicknesses of the first and second chips 110 and 120 are the same, it can be said that the substrate 100 is located in the middle of the package body 180. The semiconductor device according to the first preferred embodiment of the present invention more reliably covers the first sides 110a and 120a with the package cover 180 than the conventional semiconductor device. Therefore, the semiconductor device according to the first preferred embodiment of the present invention prevents the first sides 110a and 120a from being exposed.

In addition, the semiconductor device according to the first preferred embodiment of the present invention does not include a die pad. The slope of the second lead portion 141b of the inner lead 141 is gentler than one of the conventional semiconductor device, and the length of the second lead portion 141b is shorter than one of the conventional semiconductor device. Therefore, the lead of the semiconductor device according to the first preferred embodiment of the present invention is less likely to be deformed than that of the conventional semiconductor device. Further, when mass-produced by machines, the semiconductor device according to the first preferred embodiment of the present invention reduces production tolerance of the lead when compared to the conventional semiconductor device. Furthermore, the semiconductor device according to the first preferred embodiment of the present invention is thinner than the conventional semiconductor device, or contains more semiconductor chips than the conventional semiconductor device.

Furthermore, in the semiconductor device according to the first preferred embodiment of the present invention, the multilayer interconnections of the substrate 100 three-dimensionally connect the first chip and the leads. The length of each bonding wire is formed as short as possible using the three-dimensional connection. Therefore, the semiconductor device according to the first preferred embodiment of the present invention helps avoid electrical connection between the bonding wires, and further helps avoid cutting off the bonding wires during the molding with resin.

Figure 4:
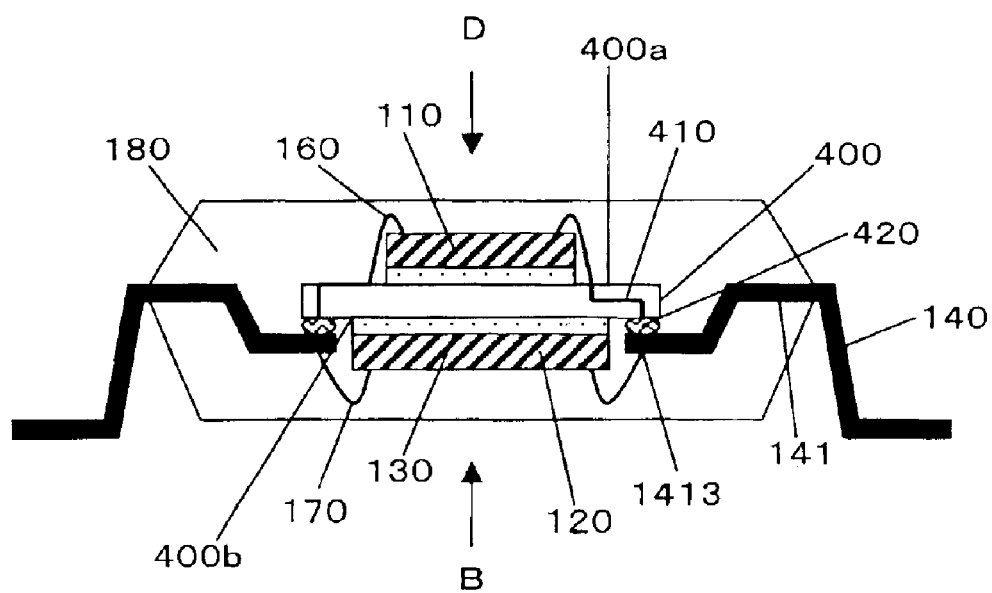
FIG. 4 is a cross sectional view of a semiconductor device according to a second preferred embodiment of the present invention.
Figure 5:
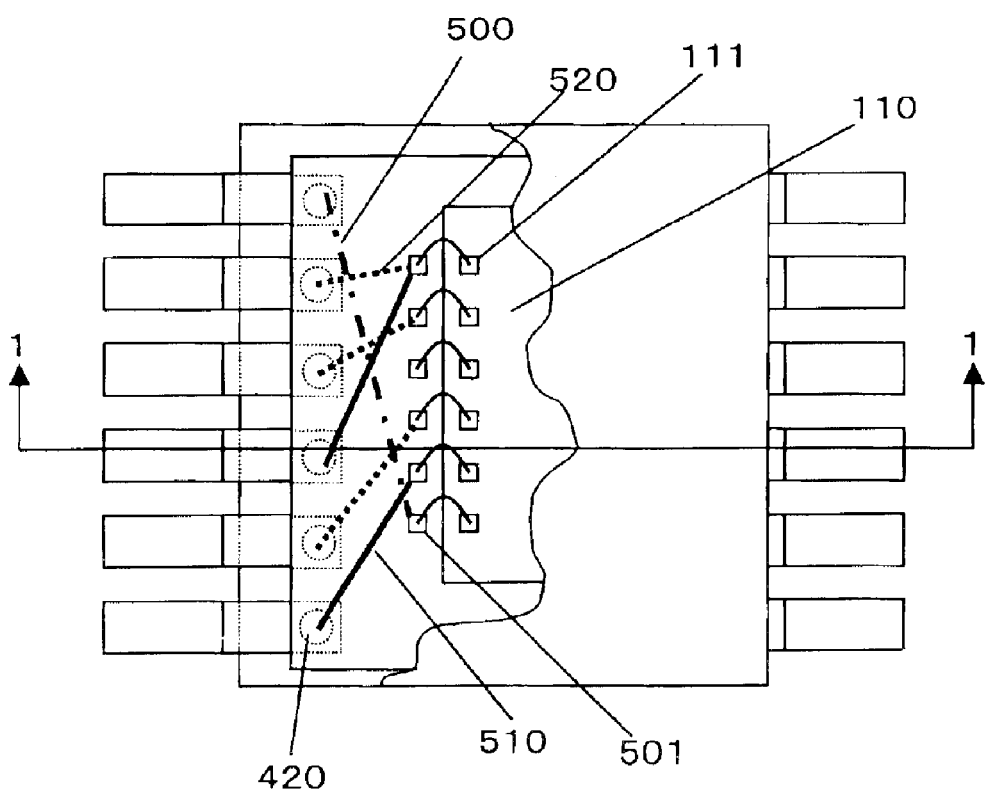
FIG. 5 is a top plan view taken in the direction of an arrow D of the semiconductor device in FIG. 4, with the resin partially removed.

A semiconductor device according to a second preferred embodiment of the present invention will be described with reference to FIGS. 4–5. FIG. 4 is a cross sectional view of the semiconductor device according to the second preferred embodiment of the present invention. FIG. 5 is a top plan view taken in the direction of an arrow D of the semiconductor device in FIG. 4, with the resin partially removed. Also, FIG. 4 is a cross-sectional view of the semiconductor device taken on line 1—1 of FIG. 5.

The semiconductor device according to the second preferred embodiment of the present invention comprises a substrate 400, the first chip (semiconductor chip) 110, the second chip (semiconductor chip) 120, the adhesive layer 130, the plurality of leads 140, the plurality of bonding wires 160 and 170, the package body (resin) 180, and a solder material (solder ball) 420.

The substrate 400 is contained within the package body 180 and has a first side 400a and an opposite second side 400b. The substrate 400 contains multilayer interconnections. Also, the substrate 400 has a central area, an intermediate area surrounding the central area, and an edge area surrounding the intermediate are. The substrate 400 has a plurality of contact pads which are formed in the intermediate area on the first side 400a thereof. The contact pads are made of copper, and a surface of each of the contact pads is covered with gold. The substrate 400 is mounted on the distal end 1413 of each inner lead portion 141 of the plurality of leads 140 by the solder material 420.

In FIG. 5 the substrate 500 contains three-layer interconnections. An interconnection 500 is formed on the first side 400a of the substrate 400, and the first side 400a is an upper layer among the three-layer interconnections. An interconnection 510 is formed on an intermediate layer among the three-layer interconnections. An interconnection 520 is formed on the lowest layer among the three-layer interconnections. Each of the interconnections 510 and 520 is electrically connected to the contact pad by a through hole which is formed under the contact pad. The lower the layer is, the more the interconnection resistance generated by a through hole increases. Therefore, it is desirable that an interconnection having a length which is long be formed on the upper layer.

As mentioned above, the substrate 400 has the plurality of contact pads 501 formed in the intermediate area on the first side 400a of the substrate 400. bonding wires 160 extend between the contact pads 501 and 111. It is desirable that the length of each bonding wire 160 is formed as short as possible to prevent the wires from electrically connecting to one another. Therefore, the first chip 110 is electrically connected to the leads 140 through the bonding wires 160, the interconnections 500, 510 or 520, interconnection 410 within substrate 400, and the solder materials 420.

In the semiconductor device according to the second preferred embodiment of the present invention, the substrate 400 is mounted on the leads 140 by the solder balls 420. The substrate 400 of the semiconductor device according to the second preferred embodiment of the present invention is not connected to the leads 140 by a bonding wire. Therefore, the semiconductor device according to the second preferred embodiment of the present invention helps avoid electrical connection between the bonding wires, and further helps avoid cutting off the bonding wires during the molding with resin.

Figure 6:
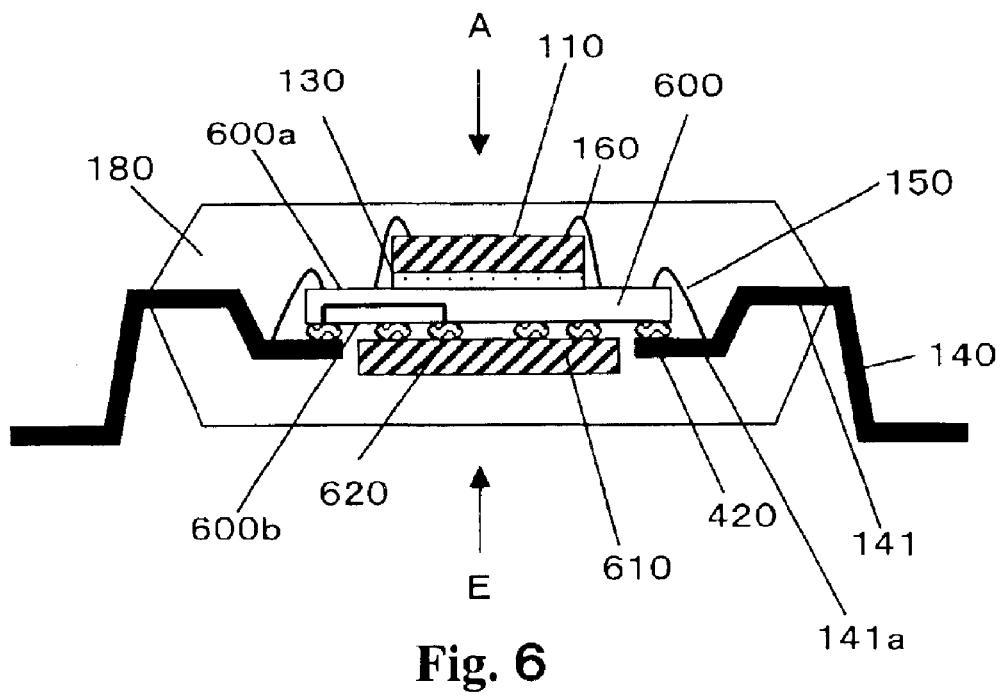
FIG. 6 is a cross sectional view of a semiconductor device according to a third preferred embodiment of the present invention.
Figure 7:
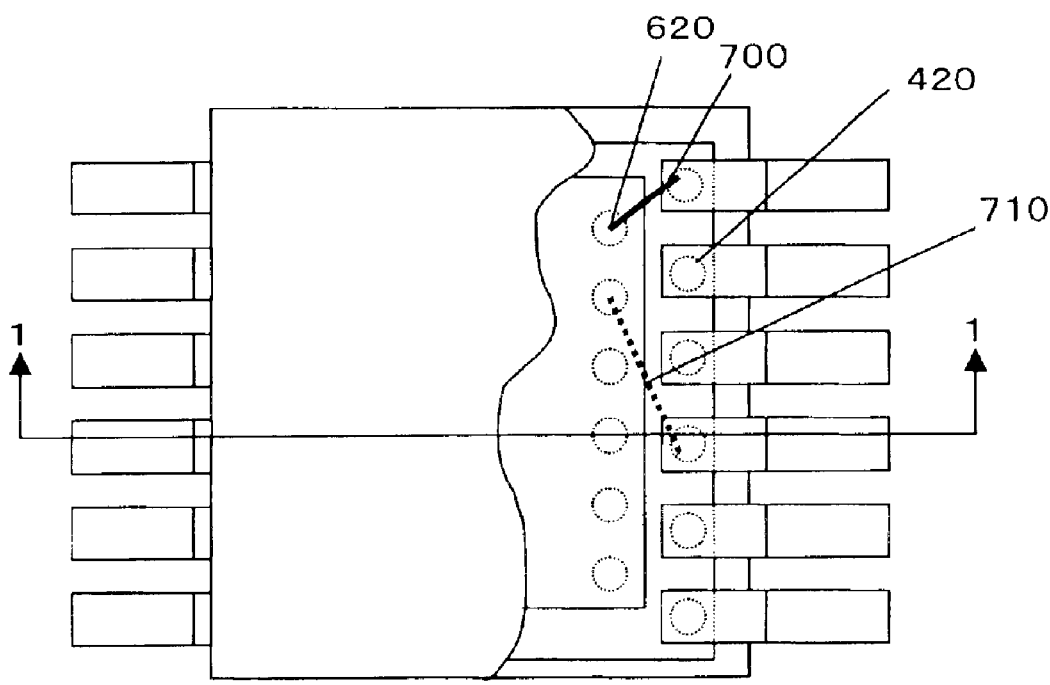
FIG. 7 is a bottom view taken in the direction of an arrow E of the semiconductor device in FIG. 6, with the resin partially removed.

A semiconductor device according to a third preferred embodiment of the present invention will be described with reference to FIGS. 6–7. FIG. 6 is a cross sectional view of the semiconductor device according to the third preferred embodiment of the present invention. FIG. 7 is a bottom plan view taken in the direction of an arrow E of the semiconductor device in FIG. 6, with the resin partially removed. Also, FIG. 6 is a cross-sectional view of the semiconductor device taken on line 1—1 of FIG. 7.

The semiconductor device according to the third preferred embodiment of the present invention comprises a substrate 600, the first chip (semiconductor chip) 110, a second chip (semiconductor chip) 610, the adhesive layer 130, the plurality of leads 140, the plurality of bonding wires 150 and 160, the package body (resin) 180, and the solder material (solder ball) 420 and 620.

The substrate 600 is contained within the package body 180 an has a first side 600a and an opposite second side 600b. The substrate 600 contains multilayer interconnections. Also, the substrate 600 has a central area, an intermediate area surrounding the central area, and an edge area surrounding the intermediate area. The substrate 600 has a plurality of contact pads which are formed on the first side 600a thereof. The contact pads are made of copper, and a surface of each of the contact pads is covered with gold. The substrate 600 is mounted on the distal end of each inner lead portion 141 of the plurality of leads 140 by the solder material 420. Some contact pads are formed in the edge area of the first side 600a and other contact pads are formed in the intermediate are. The bonding wires 150 extend between the first lead segment 141a of the inner lead portion 141 and the contact pads formed in the end area on the first side 600a of the substrate 600. The bonding wires 160 extend between the contact pads formed in the end area of the first chip 110 and the contact pads formed in the intermediate area of th first side 600a of the substrate 600. It is desirable that the length of each bonding wire is formed as short as possible to prevent the wires from electrically connecting to one another. Therefore, the first chip 110 is electrically connected to the leads 140 through the bonding wires 150 and 160 and the interconnections being formed in th substrate 600.

In FIG. 7 the substrate 600 contains three-layer interconnections. An interconnection 700 is formed on the second side 600b of the substrate 600, and wherein the second side 600b is the lowest layer among the three-layer interconnections. An interconnection 710 is formed on an intermediate layer among the three-layer interconnections. The interconnection 710 is electrically connected to the solder material by a through hole which is formed under the solder material. Therefore, the second chip 610 is electrically connected to the leads 140 through the solder material 420 and 620 and the interconnections 700 or 710.

In the semiconductor device according to the third preferred embodiment of the present invention, the second chip 610 is electrically connected to the leads 140 through the solder material 420 and 620 and the interconnections 700 or 710. The second chip 610 of the semiconductor device according to the third preferred embodiment of the present invention is not connected to the leads 140 by a bonding wire. Therefore, the semiconductor device according to the third preferred embodiment of the present invention helps avoid electrical connection between the bonding wires, and further helps avoid cutting off the bonding wires during the molding with resin.

Figure 8:
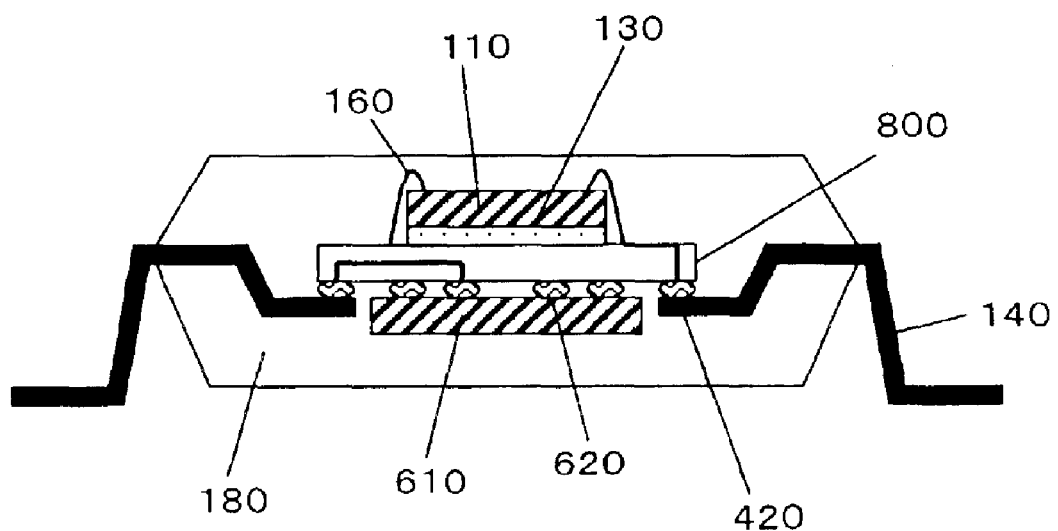
FIG. 8 is a cross sectional view of a semiconductor device according to a fourth preferred embodiment of the present invention.

A semiconductor device according to a fourth preferred embodiment of the present invention will be described with reference to FIG. 8. FIG. 8 is a cross sectional view of the semiconductor device according to the fourth preferred embodiment of the present invention.

The semiconductor device according to the fourth preferred embodiment of the present invention comprises a substrate 800, the first chip (semiconductor chip) 110, the second chip (semiconductor chip) 610, the adhesive layer 130, the plurality of leads 140, the plurality of bonding wires 160, the package body (resin) 180, and the solder material (solder ball) 420 and 620. The substrate 800 has functions which are described in the semiconductor devices according to the second and third preferred embodiments of the present invention.

In the semiconductor device according to the fourth preferred embodiment of the present invention, the substrate 800 is electrically connected to the leads 140 through the solder material 420, and the second chip 610 is electrically connected to the leads 140 through the solder material 420 and 620 and the interconnections 700 or 710. The substrate 800 and the second chip 610 are not connected to the leads 140 by bonding wires. Therefore, the semiconductor device according to the fourth preferred embodiment of the present invention helps avoid electrical connection between the bonding wires, and further helps avoid cutting off the bonding wires during the molding with resin.

Figure 9:
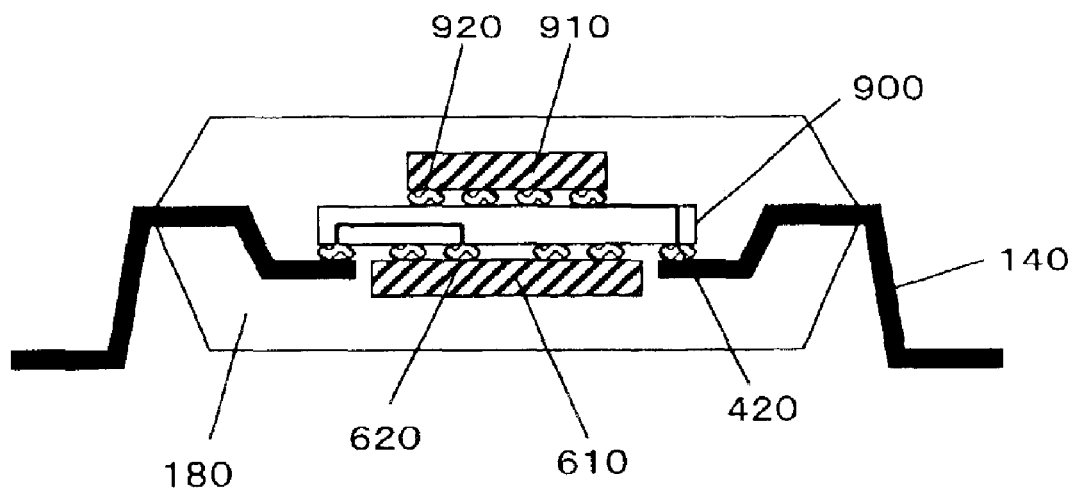
FIG. 9 is a cross sectional view of a semiconductor device according to a fifth preferred embodiment of the present invention.

A semiconductor device according to a fifth preferred embodiment of the present invention will be described with reference to FIG. 9. FIG. 9 is a cross sectional view of the semiconductor device according to the fifth preferred embodiment of the present invention.

The semiconductor device according to the fifth preferred embodiment of the present invention comprises a substrate 900, a first chip (semiconductor chip) 910, the second chip (semiconductor chip) 610, the plurality of leads 140, the package body (resin) 180, and the solder material (solder ball) 420, 620 and 920.

The substrate 900 is contained within the package body 180 and has a first side and an opposite second side. The substrate 900 contains multilayer interconnections. The first chip 910 is mounted on the first side of the substrate 900 through solder material 920, and is electrically connected to the leads 140 through the solder material 920 and 420 and the interconnections. The second chip 610 is mounted on the second side of the substrate 900 through solder material 620, and is electrically connected to the leads 140 through the solder material 620 and 420 and the interconnections.

In the semiconductor device according to the fifth preferred embodiment of the present invention, the first chip 910 is electrically connected to the substrate 900 through the solder material 920, the second chip 610 is electrically connected to the substrate 900 through the solder material 620 and the substrate 900 is electrically connected to the leads 140 through the solder material 420. The substrate 900 and the first and second chips 910 and 610 are not electrically connected to the leads 140 through the bonding wires, respectively. Therefore, the semiconductor device according to the fifth preferred embodiment of the present invention helps avoid electrical connection between the bonding wires, and further helps avoid cutting off the bonding wires during the molding with resin.

While the preferred form of the present invention has been described, it is to be understood that modifications will be apparent to those skilled in the art without departing from the spirit of the invention. For example, in each preferred embodiment, it is possible that two or more semiconductor chips are mounted on each side of the substrate. In addition, in the first and third preferred embodiments, it is possible that the bonding wires 150 are extended from the third lead segment 141*c* instead of the first lead segment 141*a*. Furthermore, in the first, second and third preferred embodiments, it is possible that the first chip 110 is mounted on the substrate by the solder material.

The scope of the invention, therefore, is to be determined solely by the following claims.

What is claimed is:

1. A semiconductor device, comprising:
   a package body;
   a substrate contained within the package body and having a first side, an opposite second side and multilayered interconnections therethrough;
   a first chip mounted on the first side of the substrate and within the package body;
   a second chip mounted on the second side of the substrate and within the package body; and
   a plurality of leads coupled to the multilayered interconnections, each of the plurality of leads including an inner lead portion contained within the package body and an outer lead portion located outside the package body, wherein each inner lead portion includes first and second bends to define a step configuration, and wherein a distal end of each inner lead portion is mounted to the second side of the substrate.

2. The semiconductor device according to claim 1, wherein each inner lead portion includes a first lead segment located between the distal end and the first bend, a second lead segment located between the first bend and the second bend, and a third lead segment located between the second bend and the outer lead portion, wherein the second lead segment crosses a plane extending coincident with the second surface of the substrate.

3. The semiconductor device according to claim 2, further comprising a first bonding wire extending between the first chip and a first electrical pad of the first side of the substrate, and a second bonding wire extending between an inner lead portion of one of the plurality of leads and a second electrical pad of the first side of the substrate.

4. The semiconductor device according to claim 3, further comprising a third bonding wire extending between the second chip and an inner lead portion of one of the plurality of leads.

5. The semiconductor device according to claim 2, herein the distal end of each inner lead portion of the plurality of leads is mounted the second side of the substrate by a solder material.

6. The semiconductor device according to claim 5, further comprising a bonding wire extending between the first chip and an electrical pad of the first side of the substrate.

7. The semiconductor device according to claim 6, wherein said bonding wire is a first bonding wire, and said semiconductor device further comprises a second bonding wire extending between the second chip and an inner lead portion of one of the plurality of leads.

8. The semiconductor device according to claim 5, further comprising a first bonding wire extending between the first chip and a first electrical pad of the first side of the substrate, and a second bonding wire extending between an inner lead portion of one of the plurality of leads and a second electrical pad of the first side of the substrate.

9. The semiconductor device according to claim 8, wherein said second chip is mounted on the second side of the substrate by a solder material.

10. The semiconductor device according to claim 6, wherein said second chip is mounted on the second side of the substrate by a solder material.

11. The semiconductor device according to claim 5, wherein said first chip is mounted on the first side of the substrate by a solder material.

12. The semiconductor device according to claim 11, wherein said second chip is mounted on the second side of the substrate by a solder material.

* * * * *